(12) United States Patent
Helber et al.

(10) Patent No.: US 7,973,902 B2
(45) Date of Patent: *Jul. 5, 2011

(54) DISPLAY WITH RGB COLOR FILTER ELEMENT SETS

(75) Inventors: Margaret J. Helber, Webster, NY (US); Paula J. Alessi, Rochester, NY (US); Mitchell S. Burberry, Webster, NY (US); Donald R. Diehl, Rochester, NY (US); Mary C. Brick, Webster, NY (US); Steven Evans, Rochester, NY (US); Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 1272 days.

This patent is subject to a terminal disclaimer.

(21) Appl. No.: 11/595,199

(22) Filed: Nov. 10, 2006

(65) Prior Publication Data

US 2008/0112069 A1    May 15, 2008

(51) Int. Cl.
*G02F 1/1345*    (2006.01)
*G02F 1/1335*    (2006.01)

(52) U.S. Cl. ........................................ 349/149; 349/106

(58) Field of Classification Search ................. None
See application file for complete search history.

(56) References Cited

U.S. PATENT DOCUMENTS

| | | |
|---|---|---|
| 5,897,981 A | 4/1999 | Kobayashi et al. |
| 2002/0014183 A1 | 2/2002 | Hall-Goulle et al. |
| 2003/0151708 A1 | 8/2003 | Funakura et al. |
| 2003/0230972 A1 | 12/2003 | Cok |
| 2004/0218115 A1* | 11/2004 | Kawana et al. ................ 349/71 |
| 2004/0262615 A1 | 12/2004 | Cok |
| 2005/0218768 A1 | 10/2005 | Saito |
| 2006/0098316 A1 | 5/2006 | Tatsuzawa et al. |
| 2006/0227260 A1* | 10/2006 | Haga et al. ..................... 349/61 |

FOREIGN PATENT DOCUMENTS

EP    0 359 934    3/1990

(Continued)

OTHER PUBLICATIONS

J. P. Spindler, et al., "Development of Tandem White Architecture for Large-Sized AMOLED Displays with Wide Color Gamut", SID International Symposium, vol. 38, No. 1, May 23, 2007, pp. 89-92.

(Continued)

*Primary Examiner* — Omar Rojas
(74) *Attorney, Agent, or Firm* — Morgan, Lewis & Bockius LLP

(57) ABSTRACT

An electronic display containing a light source and a color filter set, the color filter set comprising: a green color filter having a green filter layer comprising a first pigment having its maximum absorption at a wavelength from 600 to 700 nm wherein at least 90 volume percent of the first pigment particles have a particle size less than 300 nm, and a second pigment having its maximum absorption at a wavelength from 400 to 500 nm wherein at least 90 volume percent of the second pigment particles have a particle size less than 300 nm, and wherein the green filter layer has a transmittance of 60% or more at a wavelength of 520 nm and of no more than 10% at a wavelength of 480 nm and of no more than 10% at a wavelength of 590 nm; a blue color filter having a blue filter layer; a red color filter having a red filter layer; and wherein the color gamut defined by the electronic display has a % NTSCx,y ratio greater than 88%.

45 Claims, 3 Drawing Sheets

FOREIGN PATENT DOCUMENTS

| | | |
|---|---|---|
| EP | 0965865 | 12/1999 |
| EP | 1 298 165 | 4/2003 |
| WO | 98/45756 | 10/1998 |

OTHER PUBLICATIONS

M. J. Helber, "Color Filter Formulations for Full-Color OLED Displays: High Color Gamut Plus Improved Efficiency and Lifetime", SID International Symposium, vol. 38, No. 2, 2007, pp. 1022-1025.

T. K. Hatwar, "Low-Voltage White Tandem Structures for Fabricating RGBW AMOLED Displays", SID International Symposium, Jun. 4, 2006, vol. 37, No. 4, pp. 1964-1967.

M. J. Helber et al., "Green Color Filter Element", U.S. Appl. No. 11/595,615 (D-93114), filed Nov. 10, 2006.

M. J. Helber et al., "Blue Color Filter Element", U.S. Appl. No. 11/595,198 (D-93116), filed Nov. 10, 2006.

M. J. Helber et al., "Red Color Filter Element", U.S. Appl. No. 11/595,614 (D-93153), filed Nov. 10, 2006.

* cited by examiner

FIG. 1:
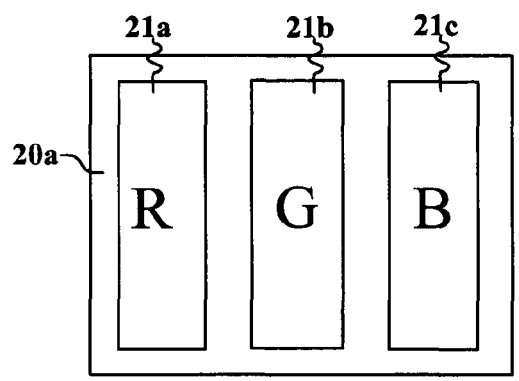
FIG. 1a
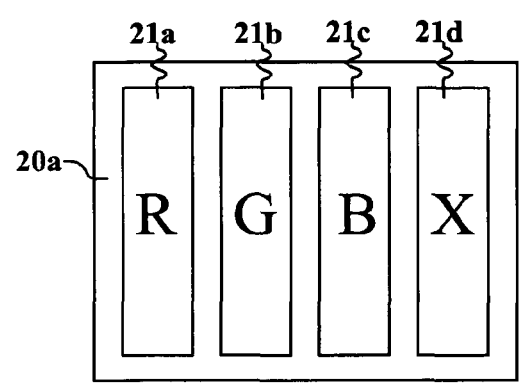
FIG. 1b
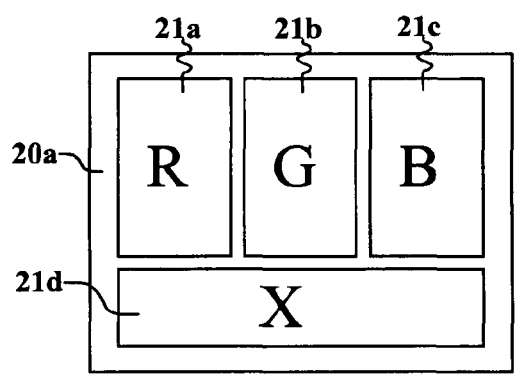
FIG. 1c
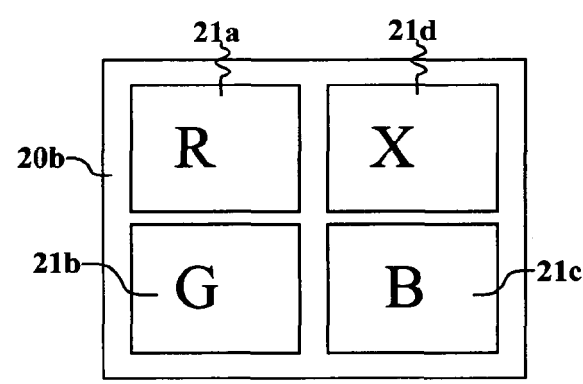
FIG. 1d

DISPLAY WITH RGB COLOR FILTER ELEMENT SETS

CROSS REFERENCE TO RELATED APPLICATIONS

Reference is made to commonly assigned U.S. patent application Ser. No. 11/393,767 filed Mar. 30, 2006, entitled "Efficient white Light OLED Display With Filters", by Hatwar et al., the disclosure of which is incorporated herein by reference. This application is part of a series of four applications filed concurrently under attorney dockets 93114, 93116, 93153, and 93154.

FIELD OF THE INVENTION

The present invention relates to electronic displays with certain color filters.

BACKGROUND OF THE INVENTION

In recent years, it has become necessary that image display devices have high-resolution and high picture quality, and it is desirable for such image display devices to have low power consumption and be thin, lightweight, and visible from wide angles. With such requirements, display devices (displays) have been developed where thin-film active elements (thin-film transistors, also referred to as TFTs) are formed on a glass substrate, with display elements (for example, organic light-emitting diode layers to produce light, or liquid-crystal layers to block light from a backlight) then being formed on top.

A problem with displays combining white-emitting devices with color filters is that the combination of emitter and color filters must provide a good color gamut for the reproduction of a wide range of colors. Color filters used in this way must have good spectroscopic characteristics, with sufficient transmittance with the predetermined visible light region and no unnecessary transmittance in other regions of the visible spectrum.

Much work has been done to identify good color filters and color filter combinations for liquid crystal displays (LCD), e.g. "Liquid Crystal Displays", Ernst Leudner ed., John Wiley & Sons (2001), pp. 28-296; "High Performance Pigments", Hugh M. Smith, John Wiley & Sons, pp. 264-265; Kudo et al., *Jpn. J. Appl. Phys.*, 37 (1998), pp. 3594-3603; Kudo et al., *J. Photopolymer Sci. Tech.* 9 (1996), pp. 109-120; Sugiura, *J. of the SID*, 1(3) (1993), pp. 341-346; F U et al., SPIE, Vol. 3560, pp. 116-121; Ueda et al., U.S. Pat. No. 6,770,405; and Machiguchi et al. U.S. Pat. Nos. 6,713,227 and 6,733,934.

Despite such improvements, display color reproduction has remained full of compromises. For example, the standards for color television gamut, as described by Fink in "Color Television Standards", McGraw-Hill, New York (1955), and in Recommendation ITU-R BT.709-5, "Parameter values for the HDTV standards for production and international programme exchange", have seldom been met. The former NTSC reference describes a good red primary as having 1931 CIE x,y chromaticity coordinates of x=0.67 and y=0.33, while a good green primary has coordinates of x=0.21 and y=0.71. The latter HDTV reference defines a good blue primary as the original PAL/SECAM blue having coordinates of x=0.15 and y=0.06. Commercially available televisions fall short of these standards and have a compromised color gamut. Takizawa, in US 2004/0105265, teaches a red filter that can achieve an x value as high as 0.65 and a y value as high as 0.33, which falls short of the NTSC reference red primary in x. Yamashita, in U.S. Pat. No. 6,856,364, teaches a red filter that can achieve an x value as high as 0.665 and a y in the range from 0.31 to 0.35. While this is an improvement over Takizawa, a red primary that meets or exceeds the x value of the NTSC primary would result in a purer red color. Yamashita further teaches a blue filter wherein the x value can range from 0.13 to 0.15 and the y value can only be as low as 0.08, and a green filter wherein the x value can range from 0.22 to 0.34 with a y value ranging from 0.56 to 0.65. Both of these fall short of the respective desired primary x,y values, which if achieved would result in purer blue and green colors, respectively.

Additionally, liquid crystal displays commonly available often use a backlight such as a cold-cathode fluorescent light (CCFL). It is a characteristic of CCFL sources commonly available that, while it provides white light consisting of a variety of wavelengths of the visible spectrum, the light is often more intense in a few narrow bands of the spectrum. These bands are generally centered in the red, the green, and the blue regions of the spectrum. The color filters needed with such light sources do not need to be especially narrow to provide a good color gamut. For example, a red filter can allow a transmission "tail" into parts of the green region of the spectrum, so long as the tail region does not include the major green emission peak, and still provide good color with such a light source.

Organic light-emitting diodes (OLEDs) provide another light source for displays. Unlike LCDs, which have a single full-display light source, OLED displays only produce light at the pixels that are required to be bright at a given time. Therefore, it is possible for OLED devices to provide displays that have reduced power requirements under normal usage. There has been much interest in broadband-emitting OLED devices in color displays. Each pixel of such a display is coupled with a color filter element as part of a color filter array (CFA) to achieve a pixilated multicolor display. The broadband-emitting structure is common to all pixels, and the final color as perceived by the viewer is dictated by that pixel's corresponding color filter element. Therefore, a multicolor or RGB device can be produced without requiring any patterning of the emitting structure. An example of a white CFA top-emitting device is shown in U.S. Pat. No. 6,392,340. Kido et al., in *Science*, 267, 1332 (1995) and in *Applied Physics Letters*, 64, 815 (1994), Littman et al. in U.S. Pat. No. 5,405, 709, and Deshpande et al., in *Applied Physics Letters*, 75, 888 (1999), report white light-producing OLED devices. Other examples of white light producing OLED devices have been reported in U.S. Pat. No. 5,683,823 and JP 07,142,169.

One property of broadband OLED displays is that, while they can vary somewhat in emission intensity at different wavelengths, they generally do not have the intense peaks characteristic of CCFL sources. Therefore, common color filters that provide adequate color gamut when coupled with a CCFL display may not provide good results with OLED displays. The example above of a red color filter with a "tail" into a portion of the green region of the spectrum can provide an adequate red emission for a CCFL source, but be totally unsuitable for use with an OLED device.

Therefore, it is a problem to be solved to produce color filters that can be coupled with broadband OLED devices to provide displays with improved color rendition.

SUMMARY OF THE INVENTION

It is therefore an object of the present invention to provide a display with a color filter set to provide improved color rendition, particularly with a broadband-emitting OLED device. Improved color rendition includes improved color gamut and related properties such as improved 1931 CIE x,y chromaticity coordinates and improved spectral curve shape.

This object is achieved by an electronic display containing a light source and a color filter set and method of making the display, the color filter set comprising:

a. a green color filter having a green filter layer comprising a first pigment having its maximum absorption at a wavelength from 600 to 700 nm wherein at least 90 volume percent of the first pigment particles have a particle size less than 300 nm, and a second pigment having its maximum absorption at a wavelength from 400 to 500 nm wherein at least 90 volume percent of the second pigment particles have a particle size less than 300 nm, and wherein the green filter layer has a transmittance of 60% or more at a wavelength of 520 nm and of no more than 10% at a wavelength of 480 nm and of no more than 10% at a wavelength of 590 nm;

b. a blue color filter having a blue filter layer;

c. a red color filter having a red filter layer; and d. wherein the color gamut defined by the electronic display has a % NTSCx,y ratio greater than 88%.

ADVANTAGES

It is an advantage of this invention that it can produce color displays with an improved combination of color and efficiency relative to existing displays. This invention can provide better color gamut and thus better rendition of colors. While existing color filters could provide better color gamut by using thicker filters, this invention can provide the improved color gamut with reduced efficiency loss.

BRIEF DESCRIPTION OF THE DRAWINGS

FIG. 1a to 1d show example pixel configurations that can be used for an electronic display using this invention;

Figure 2A:
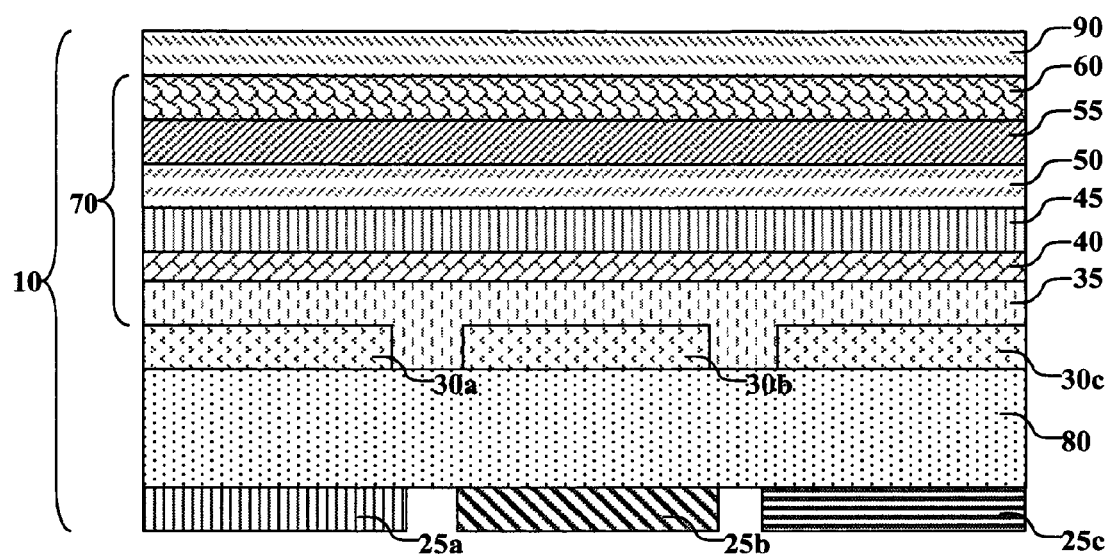
FIG. 2a shows a cross-sectional view of one embodiment of an electronic display that can be used with this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "electronic display" refers to a display wherein electronic entities control the intensity of the different areas of the display. Such electronic entities can include e.g. an off-panel driver and a series of horizontal and vertical electrodes in a passive-matrix display, or an array of thin-film transistors (TFTs) in an active-matrix display. Such displays can include liquid crystal displays (LCDs) and organic light-emitting-diode (OLED) displays. The term "OLED display", "OLED device" or "organic light-emitting display" is used in its art-recognized meaning of a display device comprising organic light-emitting diodes as pixels. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in at least the red, green, and blue regions of the visible spectrum and displaying images in any combination of hues. The complete set of colors that can be generated by a given display is commonly called the color gamut of the display. The red, green, and blue colors constitute the three primary colors from which all other colors can be generated by appropriate mixing. However, the use of additional colors to extend the color gamut or within the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. It is recognized that in full-color systems, several pixels of different colors will be used together to generate a broad range of colors, and a viewer can term such a group a single pixel. For the purposes of this discussion, such a group will be considered several different colored pixels.

The terms "maximum absorption" and "maximum transmittance" as used herein refer to the maximum light absorption and maximum light transmission, respectively, of color filters and color filter layers within the visible portion of the spectrum, i.e. from 400 nm to 700 nm. Red color filters are color filters that have a maximum transmittance substantially in the range of 600 nm to 700 nm. Green color filters are color filters that have a maximum transmittance substantially in the range of 500 nm to 600 nm. Blue color filters are color filters that have a maximum transmittance substantially in the range of 400 μm to 500 nm.

FIG. 1 illustrates example pixel configurations that can be used for an electronic display using this invention. FIG. 1a shows a stripe pattern configuration of a device with group of pixels 20a. Group of pixels 20a includes red, green, and blue color-gamut-defining pixels 21a, 21b, and 21c. FIG. 1a is a common example of an RGB display. FIG. 1b shows a configuration of a device with group of pixels 20b including red, green, and blue color-gamut-defining pixels 21a, 21b, and 21c as well as extra pixel 21d, which can be a within-gamut pixel (e.g. white) or can be another color-gamut-defining pixel. One common arrangement utilizing FIG. 1b is an RGBW display, wherein portions of the display, e.g. within-gamut pixel 21d, would not have a color filter. FIG. 1c shows another pattern configuration of a device with group of pixels 20c. FIG. 1d shows another pattern configuration of a device with group of pixels 20d. Other patterns can also be applied to the present invention, including patterns with more than 4 pixels. While in the above-mentioned examples the pixels are shown to be arranged in a certain order, the pixels can be arranged in other embodiments having different orders, and other embodiments can have pixels with differing sizes and shapes.

There are numerous configurations of color filters and displays with which this invention can be practiced. Turning now to FIG. 2a, there is shown a cross-sectional view of one embodiment of a bottom-emitting electronic display 10 that can be used with this invention. Electronic display 10 is an OLED device well/known in the art. An organic electroluminescent (EL) element 70, comprising hole-injecting layer 35, hole-transporting layer 40, light-emitting layers 45 and 50, electron-transporting layer 55, and electron-injecting layer 60, is provided over an OLED substrate 80. Current is provided by cathode 90 and anodes 30a, 30b, and 30c. The display includes at least three separate filters, e.g. red color filter 25a, green color filter 25b, and blue color filter 25c, each of which is a separate emitting unit with its own anode 30a, 30b, and 30c, respectively.

Figure 2B:
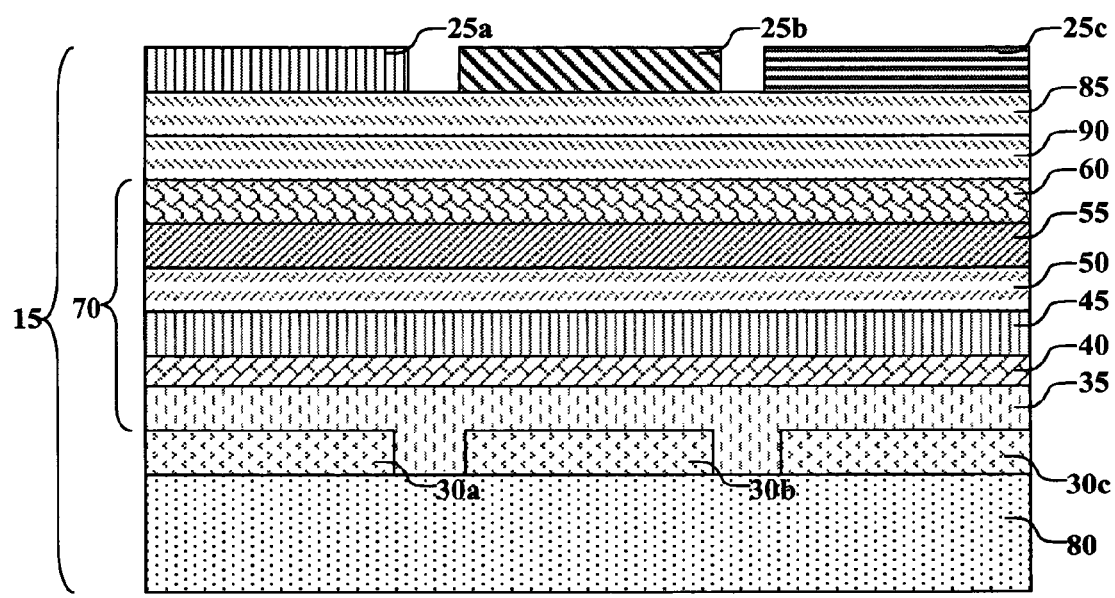
FIG. 2b shows another embodiment of an electronic display that can be used with this invention.

Color filters are often provided on a substrate. In FIG. 2a, the substrate is also the device substrate 20. Turning now to FIG. 2b, there is shown another embodiment of an electronic display with color filters. Electronic display 15 is a top-emitting device. Color filters 25a, 25b, and 25c have been provided on a separate color filter substrate 85 that is placed over the electronic display after the electronic and emissive layers are provided. It will be understood that other arrangements of color filters commonly known in the art can be used with this invention. Further, other embodiments of electronic displays can be used, e.g. tandem OLED devices, liquid crystal displays, etc.

Color Filter Pigment Preparation

The milling that has been used in the art for color filter pigments commonly produces material with a wide range of particle sizes up to 500 nm. It has been found that by milling the pigment particles to a narrow particle size range, where the particle size is predominantly less than 100 nm, yields improved color filter properties. A method for producing particles of this type has been taught by Santilli et al. in U.S. Pat. No. 5,738,716, and by Czekai et al. in U.S. Pat. No. 5,500,331, the contents of which are incorporated herein by reference. This method will be referred to herein as micromedia milling.

The process of preparing color filters from pigments commonly involves three steps: (a) a dispersing or milling step to break up the pigment to a dispersion of the primary particle; (b) a dilution and/or mixing step in which the dispersed pigment concentrate is diluted with a carrier and other addenda, which can include other pigment dispersions, to a coating-strength pigment dispersion; and (c) coating a color filter layer from the coating-strength pigment dispersion onto a substrate. Step (a) can be further detailed as: (a1) providing a pigment mixture containing a pigment and a carrier for the pigment, and optionally a dispersant; (a2) mixing the pigment mixture with milling media; (a3) introducing the mixture into a high-speed mill; (a4) milling the mixture to obtain a pigment dispersion wherein the pigment particles have the desired size; and (a5) separating the dispersion from the milling media.

In the milling step, the pigment is usually suspended in a carrier (typically the same carrier as that in the coating-strength slurry) along with rigid, inert milling media. Mechanical energy is supplied to this pigment dispersion, and the collisions between the milling media and the pigment cause the pigment to deaggregate into its primary particles. A dispersant or stabilizer, or both, is commonly added to the pigment dispersion to facilitate the deaggregation of the raw pigment, to maintain colloidal particle stability, and to retard particle reaggregation and settling.

There are many different types of materials which can be used as milling media, such as glasses, ceramics, metals, and plastics. In a useful embodiment, the grinding media can comprise particles, preferably substantially spherical in shape, e.g., beads, consisting essentially of a polymeric resin. Desirably the beads have sizes in the range of 10 to 100 microns, as described by Czekai et al.

In general, polymeric resins suitable for use as milling media are chemically and physically inert, substantially free of metals, solvent, and monomers, and of sufficient hardness and friability to enable them to avoid being chipped or crushed during milling. Suitable polymeric resins include crosslinked polystyrenes, such as polystyrene crosslinked with divinylbenzene, styrene copolymers, polyacrylates such as poly(methyl methylacrylate), polycarbonates, polyacetals, such as Derlin™, vinyl chloride polymers and copolymers, polyurethanes, polyamides, poly(tetrafluoroethylenes), e.g., Teflon™, and other fluoropolymers, high density polyethylenes, polypropylenes, cellulose ethers and esters such as cellulose acetate, poly(hydroxyethyl methacrylate), poly(hydroxyethyl acrylate), silicone containing polymers such as polysiloxanes and the like. The polymer can be biodegradable. Exemplary biodegradable polymers include polylactides, polyglycolids, copolymers of lactides and glycolide, polyanhydrides, poly(imino carbonates), poly(N-acylhydroxyproline) esters, poly(N-palmitoyl hydroxyprolino) esters, ethylene-vinyl acetate copolymers, poly(orthoesters), poly(caprolactones), and poly(phosphazenes). The polymeric resin can have a density from 0.9 to 3.0 g/cm$^3$. Higher density resins are especially useful inasmuch as it is believed that these provide more efficient particle size reduction. Especially useful are crosslinked or uncrosslinked polymeric media based on styrene.

Milling can take place in any suitable grinding mill. Suitable mills include an airjet mill, a roller mill, a ball mill, an attritor mill, a vibratory mill, a planetary mill, a sand mill, and a bead mill. A high speed mill is particularly useful. By high speed mill we mean milling devices capable of accelerating milling media to velocities greater than about 5 meters per second. The mill can contain a rotating shaft with one or more impellers. In such a mill the velocity imparted to the media is approximately equal to the peripheral velocity of the impeller, which is the product of the impeller revolutions per minute, $\pi$, and the impeller diameter. Sufficient milling media velocity is achieved, for example, in Cowles-type saw tooth impeller having a diameter of 40 mm when operated at 9,000 rpm. Useful proportions of the milling media, the pigment, the liquid dispersion medium and dispersant can vary within wide limits and depends, for example, upon the particular material selected and the size and density of the milling media etc. The process can be carried out in a continuous or batch mode.

In batch milling, a slurry of <100 μm milling media, liquid, pigment, and dispersant is prepared using simple mixing. This slurry can be milled in conventional high energy batch milling processes such as high speed attritor mills, vibratory mills, ball mills, etc. This slurry is milled for a predetermined length of time to allow commination of the active material to a minimum particle size. After milling is complete, the dispersion of active material is separated from the milling media by a simple sieving or filtration with a barrier to the milling media but not the milled pigment, e.g. a filter with a pore size of 5 μm.

In continuous media recirculation milling, a slurry of <100 μm milling media, liquid, pigment, and dispersant can be continuously recirculated from a holding vessel through a conventional media mill which has a media separator screen adjusted to >100 μm to allow free passage of the media throughout the circuit. After milling is complete, the dispersion of active material is separated from the milling media by simple sieving or filtration.

With either of the above modes the useful amounts and ratios of the ingredients of the mill grind will vary widely depending upon the specific materials. The contents of the milling mixture comprise the mill grind and the milling media. The mill grind comprises pigment, dispersant and a liquid carrier such as water. For aqueous filter slurries, the pigment is usually present in the mill grind at 1 to 50 weight %, excluding the milling media. The weight ratio of pigment to dispersant is 20:1 to 1:2. The high speed mill is a high agitation device, such as those manufactured by Morehouse-Cowles, Hockmeyer et al.

The dispersant is another important ingredient in the mill grind. Useful dispersants include sulfates (e.g. sodium dodecyl sulfate), sulfonates (e.g. N-methyl-N-oleoyl taurate), acrylic and styrene-acrylic copolymers such as those disclosed in U.S. Pat. Nos. 5,085,698 and 5,172,133 (e.g. Joncryl 678), and sulfonated polyesters and styrenics such as those disclosed in U.S. Pat. No. 4,597,794. Other patents referred to above in connection with pigment availability also disclose a wide variety of useful dispersants. The dispersants used in the examples are potassium N-methyl-N-oleoyl taurate (KOMT) and Joncryl 678.

The milling time can vary widely and depends upon the pigment, mechanical means and residence conditions selected, the initial and desired final particle size, etc. For aqueous mill grinds using the useful pigments, dispersants, and milling media described above, milling times will typically range from 1 to 100 hours. The milled pigment concentrate is conveniently separated from the milling media by filtration.

The carrier for the pigment can be an aqueous carrier medium or a non-aqueous solvent. Useful solvents have been disclosed by Czekai et al., and also in U.S. Pat. No. 5,145,684, U.S. Pat. No. 5,679,138, and EP 498,492, the disclosures of which are incorporated herein by reference. The aqueous carrier medium is water, an aqueous salt solution, or an aqueous solvent mixture comprising water and at least one water-miscible co-solvent. Selection of a suitable mixture depends on requirements of the specific application, such as desired surface tension and viscosity, the selected pigment, drying time of the color filter layer, and the type of material onto which the pigment dispersion will be coated. Representative examples of water-miscible co-solvents that can be selected include (1) alcohols, such as methyl alcohol, ethyl alcohol, n-propyl alcohol, isopropyl alcohol, n-butyl alcohol, sec-butyl alcohol, t-butyl alcohol, iso-butyl alcohol, furfuryl alcohol, and tetrahydrofurfuryl alcohol; (2) ketones or ketoalcohols such as acetone, methyl ethyl ketone, and diacetone alcohol; (3) ethers, such as tetrahydrofuran and dioxane; (4) esters, such as ethyl acetate, ethyl lactate, ethylene carbonate, and propylene carbonate; (5) polyhydric alcohols, such as ethylene glycol, diethylene glycol, triethylene glycol, propylene glycol, tetraethylene glycol, polyethylene glycol, glycerol, 2-methyl-2,4-pentanediol, 1,2,6-hexanetriol, and thioglycol; (6) lower alkyl mono- or di-ethers derived from alkylene glycols, such as ethylene glycol mono-methyl (or -ethyl)ether, diethylene glycol mono-methyl (or -ethyl)ether, propylene glycol mono-methyl (or -ethyl)ether, triethylene glycol mono-methyl (or -ethyl)ether, and diethylene glycol di-methyl (or -ethyl)ether; (7) nitrogen containing cyclic compounds, such as pyrrolidone, N-methyl-2-pyrrolidone, and 1,3-dimethyl-2-imidazolidinone; and (8) sulfur-containing compounds such as dimethyl sulfoxide and tetramethylene sulfone.

Useful non-aqueous solvents include hydrocarbons, alcohols, polyols, ethers, and esters. Solvents known to be useful for this process include toluene, hexane, ethanol, butanol, glycol, and PGMEA.

This treatment results in pigment particles wherein at least 90 weight percent of the particles have a particle size less than 300 nm. Often, 100% of the particles have a particle size less than 300 nm, and conveniently less than 200 nm. It is suitable that 100% of the particles have a particle size less than 100 nm; however, this is not possible in all cases, and it is useful that at least 90 volume percent of the pigment particles have a particle size less than 100 nm, and desirably less than 50 nm. In some cases, 90 volume percent of the pigment particles can have a particle size less than 30 nm. Usefully, no more than 10 volume percent of the pigment particles have a particles size less than 5 nm.

Coating-Strength Dispersion Preparation

In general it is desirable to make the pigment dispersion in the form of a concentrated mill grind, which is subsequently diluted to the appropriate concentration and further processed if necessary for use in coating. This technique permits preparation of a greater quantity of pigment slurry from the equipment. If the mill grind was made in a solvent, it can be diluted with water and/or optionally other solvents to the appropriate concentration. If it was made in water, it can be diluted with either additional water or water-miscible solvents to the desired concentration. If the color filter requires a mixture of pigments, it is useful at this point to mix pigment dispersions that have been milled separately. By dilution and/or mixing, the pigment dispersion is adjusted to the desired viscosity, color, hue, saturation density, and area coverage for the particular application.

In the case of organic pigments, the coating dispersion can contain up to approximately 30% pigment by weight, but will generally be in the range of approximately 0.1 to 20%, and conveniently approximately 5 to 15%, by weight of the total dispersion composition for most color filter coating applications. If an inorganic pigment is selected, the dispersion will tend to contain higher weight percentages of pigment than with comparable dispersions employing organic pigments, and can be as high as approximately 75% in come cases, since inorganic pigments generally have higher specific gravities than organic pigments.

The amount of aqueous carrier medium is in the range of approximately 70 to 98 weight %, and conveniently approximately 80 to 95 weight %, based on the total weight of the dispersion. A mixture of water and a polyhydric alcohol, such as diethylene glycol, is useful as the aqueous carrier medium. In the case of a mixture of water and diethylene glycol, the carrier medium usually contains from about 30% water/70% diethylene glycol to about 95% water/5% diethylene glycol. Useful ratios are approximately 60% water/40% diethylene glycol to about 95% water/5% diethylene glycol. Percentages are based on the total weight of the carrier medium.

It can be desirable to add additional dispersant to the mixture. Useful dispersants have been described above.

The ability to coat a given surface can be affected by the surface tension of the coating-strength dispersion. Control of surface tensions is accomplished by additions of small amounts of surfactants. The level of surfactants to be used can be determined through simple trial and error experiments. Anionic, nonionic, and cationic surfactants can be selected from those disclosed in U.S. Pat. Nos. 5,324,349; 4,156,616 and 5, 279, 654 as well as many other surfactants. Commercial surfactants include the Surfynols® from Air Products; the Zonyls® from DuPont and the Fluorads® from 3M. A useful surfactant for these dispersions is Surfactant 10G from Dixie Chemical.

Coating of Pigments

To form color filters, pigments are often coated onto a substrate. For example, a color filter layer including the pigments can be coated onto any of a variety of rigid and non-rigid transparent or semi-transparent materials, such as glass or plastic. The substrate can be a substrate used solely for forming a color filter, which can be attached to a display device. In another embodiment, the substrate can have other uses as well. For example, a color filter layer or array of color filter layers can be coated onto the bottom of a bottom-emitting display device substrate. In yet another useful embodiment, the pigments can be coated over the top of an emitting layer that forms part of a display device. The display device can be an electronic display, such as an LCD display or an OLED display.

Any of a variety of well-known coating and printing techniques can be used to prepare a color filter from the coating-strength pigment dispersion. These techniques can include, but are not limited to, extrusion-type hopper (X-hopper) coating, spin coating, spray coating, ultrasonic spray coating, knife coating, and gravure coating. The dispersion can be aqueous or non-aqueous. The coated dispersion is then typically allowed to dry to form a solid or semi-solid coating. Alternatively, the slurry can include e.g. gelling materials or crosslinking monomers to produce a solid or semi-solid coating. The coating-strength pigment dispersion can include one or more photoresist compounds well-known in the art as useful for patterning color filters, e.g. in an array of colored pixels for an electronic display. In such a case, processing of the coated dispersion can include patterned exposure and post-exposure processing to form a patterned color filter.

The final color filter layers desirably comprise at least 10% color pigment, conveniently at least 25% color pigment, and usefully at least 50% color pigment by weight.

Green Filter Pigments

A useful green color filter according to this invention has good light transmittance in the green region of the spectrum (500 to 600 nm) and good light absorption in the red and blue regions of the spectrum. One useful embodiment of this green color filter has a first pigment having good transmittance in the green region and a maximum absorption at a wavelength within the range of from 600 to 700 nm, and a second pigment having good transmittance in the green region and a maximum absorption at a wavelength within the range from 400 to 500 mm.

One useful class of pigments having good transmittance in the green region and a maximum absorption at a wavelength within the range of from 600 to 700 nm is the metallophthalocyaines. Although commercially available metallophthalocyanine pigments such as pigment blue 15 (copper phthalocyanine) are well-known for their excellent lightfastness, they tend to be more blue than green in hue, and thus are less than optimal for use in a green color filter. Hydroxyaluminum phthalocyanine exhibits a greener hue than copper phthalocyanine, but suffers from relatively poor lightfastness. One class of pigments which display both excellent hue for the first pigment requirements and lightfastness are the so-called bridged aluminum phthalocyanines as described by Regan in U.S. Pat. No. 4,311,775, the contents of which are incorporated herein by reference. These pigments are siloxane-bridged aluminum phthalocyanines and phosphonate-bridged aluminum phthalocyanines, which are generically represented by the following formulas respectively:

$$PcAl\text{—}O\text{—}[SiR_2\text{—}O]_n\text{—}AlPc \quad (1)$$

$$PcAl\text{—}O\text{—}[POR]_n\text{—}AlPc \quad (2)$$

where Pc represents a substituted or unsubstituted phthalocyanine ring, R is an alkyl group, an aryl group, or an aralkyl group, and n is an integer from 0 to 4. For a more complete description of these pigments, see U.S. Pat. No. 4,311,775. A useful siloxane-bridged aluminum phthalocyanine is bis(phthalocyanylalumino)tetraphenyldisiloxane (Structure 3 below, Pc is unsubstituted, R is phenyl, and n is 2). Mixtures of bis(phthalocyanylalumino)tetraphenyldisiloxane with either copper phthalocyanine, hydroxyaluminum phthalocyanine, or both can also be used provided that bis(phthalocyanylalumino)tetraphenyldisiloxane comprises at least 80 weight percent of the mixture.

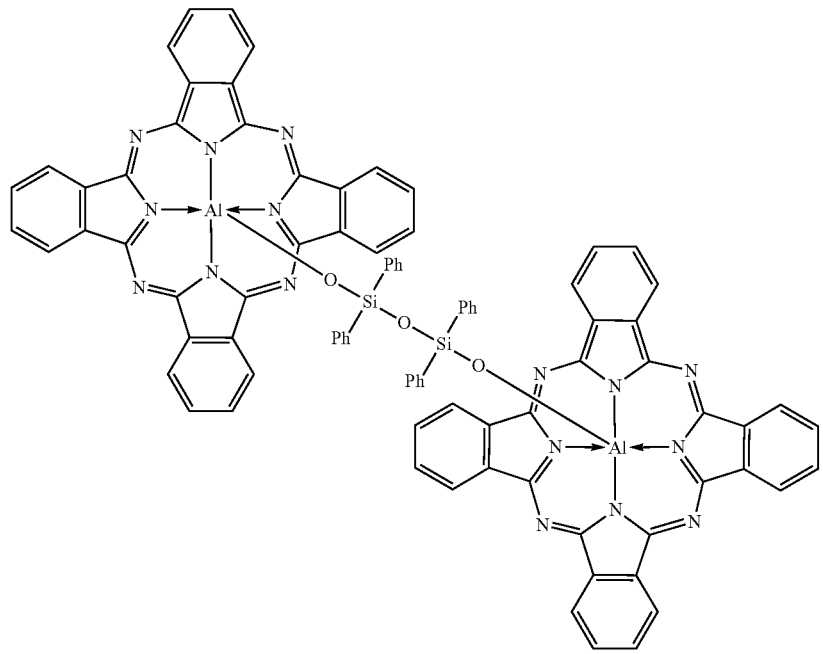

(3)

While bridged aluminum phthalocyanine compounds are more green than copper phthalocyanine compounds, they still have significant transmittance in the blue region. To be effective in a green filter, they are desirably combined with a second pigment having a maximum absorption at a wavelength within the range from 400 to 500 nm. One class of pigments that can be used is that which is commercially known as the monoazo yellow pigment class, or more simply monoazo pigments. Useful yellow pigments include Pigment Yellow 138, Pigment Yellow 139, Pigment Yellow 180, Pigment Yellow 74, Pigment Yellow 185, Pigment Yellow 154 and mixtures thereof are preferred. Especially preferred is Pigment Yellow 74. Pigment numbers are as designated in the Color Index.

When pigment particles are prepared as described herein, useful ratios of the first pigment to the second pigment have been found to be in the range of 40:60 to 75:25 by weight. A color filter layer prepared from such dispersions can have good transmittance in the green region of the visible spectrum while having good absorption in other regions of the spectrum. The green filter layer so prepared can have a maximum transmittance of 609% or more at a wavelength of 520 nm, but of no more than 10% at a wavelength of 590 nm and usefully no more than 10% at a wavelength of 580 nm, and of no more than 10% at a wavelength of 480 nm. The width at half-height of such a filter layer can be 80 nm or less. The width at half-height is defined as the width of the transmittance peak at one-half of the maximum transmittance. Such a filter layer has chromaticity coordinates (x,y) in the 1931 CIE XYZ colorimetric system, when calculated using CIE Standard Illuminant D65 or Standard Illuminant C, that satisfy the expressions $0.19 \leq x \leq 0.24$ and $0.68 \leq y \leq 0.72$. As will be seen, this is a very pure green color.

Blue Filter Pigments

A useful blue color filter according to this invention has good light transmittance in the blue region of the spectrum and good light absorption in the red and green regions of the spectrum. One useful embodiment of this blue color filter has a first pigment having good transmittance in the blue region and a maximum absorption at a wavelength within the range of from 550 to 650 nm, and a second pigment having good transmittance in the blue region and a maximum absorption at a wavelength within the range from 500 to 600 nm. A useful first pigment is a metallophthalocyanine pigment, and is conveniently copper phthalocyanine or a copper phthalocyanine derivative. A useful second pigment is a dioxazine pigment, and is conveniently Pigment Violet 23.

When pigment particles are prepared as described herein, useful ratios of the first pigment to the second pigment have been found to be in the range of 20:80 to 95:5 by weight. A color filter layer prepared from such dispersions can have good transmittance in the blue region of the visible spectrum while having good absorption in other regions of the spectrum. The blue filter layer so prepared can have a maximum transmittance of 60% or more at a wavelength of 450 nm, but of no more than 10% at all wavelengths in the range from 515 nm to 700 nm, and usefully no more than 5% at all wavelength in the range from 520 nm to 700 nm. Such a filter layer has chromaticity coordinates (x,y) in the 1931 CIE XYZ calorimetric system, when calculated using CIE Standard Illuminant D65 or Standard Illuminant C, that satisfy the expressions $0.134 \leq x \leq 0.15$ and $0.03 \leq y \leq 0.06$, provided that such combination of coordinates is within the spectrum locus defined by the 1931 CIE x,y chromaticity diagram. As will be seen, this is a very pure blue color.

Red Filter Pigments

A useful red color filter according to this invention has good light transmittance in the red region of the spectrum and good light absorption in the green and blue regions of the spectrum. This has commonly been achieved by the use of two pigments: a red pigment having good transmittance in the red region of the spectrum, and a yellow pigment that has a maximum absorption at a wavelength within the range from 400 to 500 nm. The yellow pigment has been commonly used to reduce transmission of residual blue light by the red color filter in order to produce a good red color. Some filters have been prepared using only a red pigment. These filters, however, suffer from excessive blue light transmission, and are not suitable for use in some electronic displays, e.g. OLED displays.

It has been found unexpectedly that the application of this invention to a red pigment can produce a red color filter, with good absorption in both the green and blue regions of the spectrum, wherein the pigment consists essentially of the single red pigment without the necessity of a yellow pigment as required by the prior art. One useful embodiment of this red color filter has a pigment having good transmittance in the red region and a maximum absorption at a wavelength within the range of from 450 to 575 nm. A useful pigment meeting these requirements is a diketopyrrolopyrrole pigment, and is conveniently Pigment Red 254.

When pigment particles are prepared as described herein, a color filter layer prepared from such dispersions can have good transmittance in the red region of the visible spectrum while having good absorption in other regions of the spectrum. The red filter layer so prepared can have a maximum transmittance of 80% or more at a wavelength of 650 nm, of no more than 10% at a wavelength of 585 nm, and no more than 5% at all wavelengths in the range from 580 nm to 410 nm. Usefully, the red filter layer has a transmittance of no more than 2% at all wavelengths in the range from 580 nm to 410 nm, of no more than 1% at all wavelengths in the range from 575 nm to 410 nm, and of no more than 2% at 400 nm. Such a filter layer has chromaticity coordinates (x,y) in the 1931 CIE XYZ colorimetric system, when calculated using CIE Standard Illuminant D65 or Standard illuminant C, that satisfy the expressions $0.665 \leq x \leq 0.68$ and $0.3 \leq y \leq 0.34$, provided that such combination of coordinates is within the spectrum locus defined by the 1931 CIE x,y chromaticity diagram. As will be seen, this is a very pure red color.

Dispersion Preparation

Preparation of Pigment Red 254 Dispersion.

A mixture of Pigment Red 254 was prepared by adding 60 g Pigment Red 254 Irgaphor Red BT-CF (Ciba Specialty Chemicals), 18 g potassium N-oleyl-N-methyltaurate dispersant, 222 g high purity water and 360 g 50-micron milling media composed of crosslinked polystyrene divinyl benzene to a 2 L stainless steel vessel jacketed with chilled water. The mixture was stirred with a 50 mm diameter high-shear Cowles disperser blade at an average rate of 3200 rpm for 52 hours. After milling, the dispersion was separated from the milling media by filtration through a 5 micron fiberglass filter and further diluted with high purity water to a concentration of 12.18 wt % pigment.

Preparation of Bridged Aluminum Phthalocyanine Dispersion.

A dispersion of bridged aluminum phthalocyanine was prepared by adding 1600 g bridged aluminum phthalocyanine pigment, 960 g potassium N-oleyl-N-methyltaurate dispersant, 5440 g high purity water and 8000 g 50-micron milling media composed of crosslinked polystyrene divinyl benzene to a 37 L stainless steel vessel jacketed with 25 C water. The mixture was stirred with a 152 mm diameter Hockmeyer® Poly high shear disperser blade at an average rate of 2546 rpm for 16 hours. After milling, the dispersion was separated from the milling media with a 5 micron filter and further diluted with high purity water to a concentration of 11.65 wt % pigment.

Preparation of Pigment Yellow 74 Dispersion.

A mixture of Pigment Yellow 74 was prepared by adding 150 g Pigment Yellow 74 Birchwood Yellow (Dominion Colour) pigment, 129.3 g of a 29.1 wt % aqueous solution of Joncryl® 678 dispersant neutralized 95% with potassium Table 1 shows the relative amounts of pigment, dispersant, and water in the dispersions prepared above that were used to make color filters as described below. Table 1 also shows particle size distribution of the pigments in the dispersions, as measured by dynamic light scattering using a Microtrac® UPA150 particle analyzer. Examination of the dispersion by transmitted light microscopy at 1110× magnification showed all particles to be well dispersed.

TABLE 1

|  | Pigment | | | | |
| --- | --- | --- | --- | --- | --- |
|  | Pigment Red 254 | Bridged Al Pc | Pigment Yellow 74 | Pigment Violet 23 | Pigment Blue 15:6 |
| dispersant | KOMT | KOMT | Joncryl 678-KOH | KOMT | KOMT |
| wt % pigment | 12.18 | 11.66 | 10.42 | 8.62 | 9.98 |
| wt % dispersant | 3.65 | 7.00 | 2.61 | 2.59 | 2.99 |
| wt % water | 84.17 | 81.34 | 86.98 | 88.79 | 87.03 |
| 100% by volume less than (microns): | 0.1445 | 0.1445 | 0.0608 | 0.1022 | 0.1719 |
| 90% by volume less than (microns): | 0.0553 | 0.0435 | 0.0113 | 0.0248 | 0.0304 |
| 50% by volume less than (microns): | 0.0151 | 0.0136 | 0.0089 | 0.0116 | 0.0126 |
| 10% by volume less than (microns): | 0.0114 | 0.0104 | 0.0074 | 0.0093 | 0.0100 | hydroxide, 720.7 g high purity water to a 5 L stainless steel vessel jacketed with chilled water. The mixture was premixed with a 50 mm diameter rotor-stator blade at an average rate of 1400 rpm for 3 hours. After the premix step, 1200 g 50-micron milling media composed of crosslinked polystyrene divinyl benzene were added and the mixture was stirred with a 70 mm diameter high-shear Cowles disperser blade at an average rate of 1400 rpm for 115 hours. After milling, the dispersion was separated from the milling media by filtration through a 5 micron fiberglass filter and further diluted with high purity water to a concentration of 10.42 wt % pigment.

Preparation of Pigment Violet 23 Dispersion.

A mixture of Pigment Violet 23 was prepared by adding 39 g Pigment Violet 23 Cromophtal Violet GM (Ciba Specialty Chemicals), 11.7 g potassium N-oleyl-N-methyltaurate dispersant, 249.3 g high purity water and 360 g 50-micron milling media composed of crosslinked polystyrene divinyl benzene to a 2 L stainless steel vessel jacketed with chilled water. The mixture was stirred with a 50 mm diameter high-shear Cowles disperser blade at an average rate of 3800 rpm for 48 hours. After milling, the dispersion was separated from the milling media by filtration through a 5 micron fiberglass filter and further diluted with high purity water to a concentration of 8.62 wt % pigment.

Preparation of Pigment Blue 15:6 Dispersion.

A mixture of Pigment Blue 15:6 was prepared by adding 39 g PB15:6 Heliogen Blue D6700T (BASF), 11.7 g potassium N-oleyl-N-methyltaurate dispersant, 249.3 g high purity water and 360 g 50-micron milling media composed of crosslinked polystyrene divinyl benzene to a 2 L stainless steel vessel jacketed with chilled water. The mixture was stirred with a 60 mm diameter high-shear Cowles disperser blade at an average rate of 2700 rpm for 23 hours. After milling, the dispersion was separated from the milling media by filtration through a 5 micron fiberglass filter and further diluted with high purity water to a concentration of 9.98 wt % pigment.

Filter Preparation

Inventive Green Filter ($G_j$)

54.24 g of the above bridged aluminum phthalocyanine dispersion was mixed with 30.19 g of the above Pigment Yellow 74 dispersion, 19.07 g Joncryl 678, and 10 drops of a 10% Surfactant 10G solution. The resulting slurry was then coated onto a polyester sheet using an x-hopper syringe coater at a rate of 1.2 $cm^3/ft^2$. This provided a coating with an average thickness when dry of 2.2 microns.

Inventive Blue Filter ($B_j$)

50 g of the above Pigment Blue 15:6 dispersion was mixed with 18.5 g of the above Pigment Violet 23 dispersion, 68.5 g Joncryl 678, and 10 drops of a 10% Surfactant 10G solution. The resulting slurry was then coated onto a polyester sheet using an x-hopper syringe coater at a rate of 1.4 $cm^3/ft^2$. This provided a coating with an average thickness when dry of 2.6 microns.

Inventive Red Filter ($R_j$)

10 g of the above Pigment Red 254 dispersion was mixed with 5 g Joncryl 678 and 2 drops of a 10% Surfactant 10G solution. The resulting slurry was then coated onto a polyester sheet using an x-hopper syringe coater at a rate of 3.5 $cm^3/ft^2$. This provided a coating with an average thickness when dry of 8.4 microns.

First Comparative Filters

Comparative filters—Comparative Green Filter 1 ($G_{c1}$), Comparative Blue Filter 1 ($B_{c1}$), and Comparative Red Filter 1 ($R_{c1}$)—were obtained from a commercially available LCD television.

The visible transmittance spectra of the above filters were measured with a Perkin-Elmer Lambda 12 spectrometer with an integrating filter. The results are shown in the tables below.

TABLE 2

| | Color Filter: | |
|---|---|---|
| | Inventive Green Filter | Comparative Green Filter 1 |
| Peak Transmittance | 518 nm | 517 nm |
| % T at Peak Transmittance | 61% | 84% |
| Bandwidth at ½ Peak T | 61 nm | 102 nm |
| % T at 550 nm | 40% | 76% |
| % T at 573 nm | 10% | 57% |
| % T at 579 nm | 5% | 49% |
| % T at 587 nm | 2% | 36% |
| Red Transmittance | <1% 593 to 700 nm | <1% 634 to 674 nm, up to 5% at 700 nm |
| % T at 500 nm | 40% | 75% |
| % T at 490 nm | 10% | 65% |
| % T at 486 nm | 4% | 57% |
| Blue Transmittance | <1% 480 to 400 nm | <1% 451 to 400 nm |

The bandwidth at half peak transmittance of the inventive green filter is significantly narrower than that of the comparative green filter. Also the hypsochromic and bathochromic tails for the inventive green filter are much lower in the red and blue spectral regions than those of the comparative green filter. These spectral transmittance characteristics mean that the inventive green filter, although lower in peak transmittance, is a much purer green than the comparative green filter.

TABLE 3

| | Color Filter: | |
|---|---|---|
| | Inventive Blue Filter | Comparative Blue Filter 1 |
| Peak Transmittance | 448 nm | 462 nm |
| % T at Peak Transmittance | 66% | 76.5% |
| % T at 430 nm | 57% | 61% |
| % T at 480 nm | 43% | 70% |
| % T at 505 nm | 10% | 43% |
| % T at 512 nm | 5% | 33% |
| % T at 517 nm | 3% | 25% |
| Green & Blue Transmittance | <1.5% from 526 to 700 nm | <1.5% from 552 to 700 nm |

The inventive blue filter peak transmittance is at a wavelength that is hypsochromic to the comparative blue filter peak, which means that it has less unwanted transmittance into the green portion of the visible spectrum. Also the transmittance of the bathochromic tail of the inventive blue filter is much lower at wavelengths from 505 to 700 nm, and especially in the near-green region of 500 to 550 µm, than that of the comparative blue filter. These two spectral transmittance characteristics mean that the inventive blue is a purer blue (i.e. less cyan) than the comparative blue filter, due to the small particle size of the pigments in the inventive filter. A further example of this can be seen when compared to the blue filter of a Sony Qualia television, which contains similar materials with unknown formulation. When measured as described herein, it has a transmittance at 515 nm of 17%, which is much greater than the inventive filter at the same wavelength, and is not desirable for good blue color purity.

TABLE 4

| | Color Filter: | |
|---|---|---|
| | Inventive Red Filter | Comparative Red Filter 1 |
| Peak Transmittance | 620 to 700 nm | 620 to 700 nm |
| % T at 620/700 nm | 78%/93.5% | 85%/96% |
| % T at 600 nm | 48% | 58.5% |
| % T at 585 nm | 6% | 14.5% |
| % T at 580 nm | 0.5% | 7% |
| Green & Blue Transmittance | <0.5% from 580 to 406 nm | <0.5% from 508 to 454 nm |
| % T at 400 nm | 1% | 11% |

As is shown by the 580 and 585 nm transmittance values for the hypsochromic tail, the inventive red filter has a sharper cut than the comparative red filter. Also the transmittance of the comparative red filter rises from 0.5% at 508 nm to 11% at 400 nm, whereas the inventive red filter stays less than 0.5% from 580 nm down to 406 nm and rises only to 1% at 400 nm. These two spectral transmittance characteristics mean that the inventive red filter is a purer red than the comparative red filter because of extremely low transmittance in the green and blue portions of the visible spectrum, due to the small particle size of the pigments in the inventive filter.

The color purity of the filters can be further demonstrated with excitation purity, which is a common CIE metric used to measure the purity of a color point plotted on the 1931 CIE chromaticity diagram. The spectral characteristics of selected illuminants can be cascaded with the spectral transmittance of the color filters, and with the 1931 CIE color matching functions, as described in "Colorimetry", CIE Publication 15: 2004 3rd Edition, published by the CIE Central Bureau in Vienna, Austria. The result of this cascade is a set of chromaticity coordinates that pertains to a given illuminant on the 1931 CIE chromaticity diagram. The excitation purity is the length of the line segment joining the illuminant point with the color point relative to the length of the line segment joining the illuminant point, the color point, and the spectrum locus point. A color with an excitation purity of 1.0 lies on the spectrum locus and represents the purest spectral color possible. One can further calculate a difference from the predetermined standard by the formula:

$$\text{Delta CIE } x,y = SQRT[(x_1-x_{NTSC})^2+(y_1-y_{NTSC})]$$

When the green filters are cascaded with CIE Standard Illuminant C, and the 1931 CIE color matching functions, the following table shows the resulting chromaticity coordinates. The resulting CIE chromaticity coordinates for the inventive green filter are lower in x and significantly higher in y than those for the comparative green filter, making the inventive green filter less yellow and a much more pure green color.

TABLE 5

| | Green Filter | | |
|---|---|---|---|
| | Filter or Primary: | | |
| | Inventive Green | Comparative Green | NTSC Green Primary |
| 1931 CIE x, y (Std. III. C) | 0.2049, 0.6958 | 0.2738, 0.5845 | 0.21, 0.71 |
| Excitation Purity (C) | 0.8057 | 0.6448 | 0.8462 |
| Delta CIE x, y from NTSC Primary (C) | 0.0151 | 0.1408 | 0 |
| 1931 CIE x, y (Std. III. D65) | 0.2005, 0.7021 | 0.2704, 0.5931 | 0.21, 0.71 |

TABLE 5-continued

Green Filter

| | Filter or Primary: | | |
|---|---|---|---|
| | Inventive Green | Comparative Green | NTSC Green Primary |
| Excitation Purity (D65) | 0.8049 | 0.6494 | 0.8426 |
| Delta CIE x, y from NTSC Primary (D65) | 0.0124 | 0.1316 | 0 |

The inventive green has a much higher excitation purity than the comparative green filter, and it is very close to the excitation purity for the NTSC green primary. The NTSC green primary is the purest standard green primary made to date. When the NTSC standards were set in 1953, the green primary was based on zinc silicate. The luminance of the green zinc silicate NTSC primary was unacceptably low. As the TV industry moved away from the green zinc silicate primary, new green primaries were found that would deliver twice the luminance of the zinc silicate at a cost of less pure green chromaticities. The TV industry has not been able to get back to the pure NTSC green primary chromaticities since 1953 because of the luminance problem. This inventive green allows the purest green primary set by the NTSC standard in 1953 to come back with luminance higher than the zinc silicate green primary of 1953. The inventive green chromaticity lies close to the NTSC green primary chromaticity. The x,y delta for the comparative green filter is much larger than that for inventive green filter, making the comparative green filter a much less pure green color. The inventive green filter is a much purer green than either the comparative green filter or the green filter taught by Yamashita in U.S. Pat. No. 6,856,364.

When the blue filters are cascaded with CIE Standard Illuminant D65, and the 1931 CIE color matching functions, Table 6 shows the resulting chromaticity coordinates.

TABLE 6

Blue Filter

| | Filter or Primary: | | |
|---|---|---|---|
| | Inventive Blue | Comparative Blue | Rec. 709 Blue Primary |
| 1931 CIE x, y (Std. Ill. C) | 0.1452, 0.0501 | 0.1353, 0.1019 | 0.15, 0.06 |
| Excitation Purity (C) | 0.9610 | 0.8964 | 0.9265 |
| Delta CIE x, y from HDTV Rec. 709 Primary (C) | 0.0110 | 0.0444 | 0 |
| 1931 CIE x, y (Std. Ill. D65) | 0.1445, 0.0523 | 0.1341, 0.1096 | 0.15, 0.06 |
| Excitation Purity (D65) | 0.9533 | 0.8900 | 0.9209 |
| Delta CIE x, y from HDTV Rec. 709 Primary (D65) | 0.0095 | 0.0521 | 0 |

The resulting CIE chromaticity coordinates for the inventive blue filter are higher in x and much lower in y than the comparative blue filter, making the inventive filter blue less cyan and hence a more pure blue color. The inventive blue has a higher excitation purity than the comparative blue filter, and it is close to the excitation purity for the HDTV Rec. 709 blue primary, as defined in Recommendation ITU-R BT.709-5, "Parameter values for the HDTV standards for production and international programme exchange". This ITU recommendation defines an "aim" blue primary that is purer than all preceding standards. The inventive blue chromaticity lies close to the HDTV Rec. 709 blue primary chromaticity so that its x,y delta is very almost zero. The x,y delta for the comparative blue filter is more than five times larger, making the comparative blue filter a much less pure blue color. The inventive blue filter is a much purer blue than either the comparative blue filter or the blue filter taught by Yamashita in U.S. Pat. No. 6,856,364.

When the red filters are cascaded with CIE Standard Illuminant C, and the 1931 CIE color matching functions, Table 7 shows the resulting chromaticity coordinates.

TABLE 7

Red Filter

| | Filter or Primary: | | |
|---|---|---|---|
| | Inventive Red | Comparative Red | NTSC Red Primary |
| 1931 CIE x, y (Std. Ill. C) | 0.6744, 0.3201 | 0.6509, 0.3256 | 0.67, 0.33 |
| Excitation Purity (C) | 0.9823 | 0.9327 | 1.0 |
| Delta CIE x, y from NTSC Primary (C) | 0.0108 | 0.0196 | 0 |
| 1931 CIE x, y (Std. Ill. D65) | 0.6738, 0.3210 | 0.6508, 0.3270 | 0.67, 0.33 |
| Excitation Purity (D65) | 0.9820 | 0.9358 | 1.0 |
| Delta CIE x, y from NTSC Primary (D65) | 0.0098 | 0.0194 | 0 |

The resulting CIE chromaticity coordinates for the inventive red filter are higher in x at about the same y as the comparative red filter, making the inventive red less orange and hence a more pure red color. The inventive red has a higher excitation purity than the comparative red filter 1; it is only 0.02 away from the purest spectral color, which is the NTSC red primary at an excitation purity of 1.0. The NTSC red primary is the purest standard red primary made to date. When the NTSC standards were set in 1953, the red primary was based on zinc phosphate. The luminance of the red zinc phosphate NTSC primary was unacceptably low. As the TV industry moved away from the red zinc phosphate primary, new red primaries were found that would deliver twice the luminance of the zinc phosphate at a cost of less pure red chromaticities. The TV industry has not been able to get back to the pure NTSC red primary chromaticities since 1953 because of the luminance problem. This inventive red allows the purest red primary set by the NTSC standard in 1953 to come back with luminance higher than the zinc phosphate red primary of 1953. The inventive red chromaticity lies almost exactly on the NTSC red primary chromaticity. The x,y delta for the comparative red filter is almost twice as large as that for inventive red, making the comparative red a less pure red color. The inventive red filter is a much purer red than either the comparative red filter or the red filters taught by Yamashita in U.S. Pat. No. 6,856,364 and Takizawa in US 2004/0105265.

Second Comparative Filters

Comparative filters—Comparative Green Filter 2 ($G_{c2}$), Comparative Blue Filter 2 ($B_{c2}$), and Comparative Red Filter 2 ($R_{c2}$)—were obtained by mathematically thickening the above first comparative filters using Beer's Law.

Table 8 shows the CIE x and y coordinates and the relative luminance of a white OLED device, as described by Hatwar et al. in U.S. patent application Ser. No. 11/393,767 filed Mar. 30, 2006, entitled "Efficient white Light OLED Display With Filters", cascaded using the above filters.

TABLE 8

| Filter | CIE value x | CIE value y | Luminance (cd/m²) |
|---|---|---|---|
| Red Comparative 1 ($R_{c1}$) | 0.647 | 0.343 | 488.89 |
| Red Inventive ($R_i$) | 0.663 | 0.332 | 389.51 |
| Red Comparative 2 ($R_{c2}$) | 0.670 | 0.329 | 356.45 |
| Green Comparative 1 ($G_{c1}$) | 0.276 | 0.592 | 1763.6 |
| Green Inventive ($G_i$) | 0.208 | 0.708 | 843.86 |
| Green Comparative 2 ($G_{c2}$) | 0.208 | 0.698 | 662.79 |
| Blue Comparative 1 ($B_{c1}$) | 0.130 | 0.111 | 334.6 |
| Blue Inventive ($B_i$) | 0.139 | 0.057 | 126.1 |
| Blue Comparative 2 ($B_{c2}$) | 0.137 | 0.054 | 71.8 |

Table 8 shows that the inventive filters, when compared to respective currently available filters, show improved color. The Comparative 2 examples show that it is possible to use existing filter formulation to achieve a similar color; however, the luminance is significantly degraded relative to the inventive filters.

A full-color electronic display can be constructed comprising a broadband-emitting light source and a color filter set of at least three color filters with which a large variety of colors can be produced. The color-gamut-defining primaries for the display result from cascading the color filters with the light source. All colors capable of being reproduced by that display are found within the chromaticity triangle formed by the color-gamut-defining primaries. The color filter set can comprise a green color filter having a green filter layer, a blue color filter having a blue filter layer, and a red color filter having a red filter layer. The use of one or more of the inventive color filters in the color filter set provides an improved color gamut. The color gamut with three primary colors (the color-gamut-defining primaries) is represented by a triangle on the 1931 CIE x,y chromaticity diagram. One useful measure of the color gamut is the % NTSCx,y ratio, which is the ratio of the area of the triangle produce by a given set of red, green, and blue primary emitters to the area of the triangle produced by the NTSC reference red, green, and blue primaries. The NTSC reference primaries are defined in e.g. Fink, "Color Television Standards", McGraw-Hill, New York (1955).

Table 9 shows the color gamut (% NTSCx,y ratio) of combinations of the inventive and comparative filters using the above OLED device.

TABLE 9

| Example | Inventive/ Comparative | Red Filter | Green Filter | Blue Filter | NTSC Ratio |
|---|---|---|---|---|---|
| 1 | Comparative | $R_{c1}$ | $G_{c1}$ | $B_{c1}$ | 67.73 |
| 2 | Inventive | $R_i$ | $G_{c1}$ | $B_{c1}$ | 70.74 |
| 3 | Inventive | $R_{c1}$ | $G_i$ | $B_{c1}$ | 91.65 |
| 4 | Inventive | $R_{c1}$ | $G_{c1}$ | $B_i$ | 73.44 |
| 5 | Inventive | $R_i$ | $G_i$ | $B_{c1}$ | 95.04 |
| 6 | Inventive | $R_i$ | $G_{c1}$ | $B_i$ | 76.70 |
| 7 | Inventive | $R_{c1}$ | $G_i$ | $B_i$ | 98.23 |
| 8 | Inventive | $R_i$ | $G_i$ | $B_i$ | 101.88 |
| 9 | Comparative | $R_{c2}$ | $G_{c2}$ | $B_{c2}$ | 102.46 |

Table 9 shows that each of the inventive red, blue, and green color filters provides improved color gamut relative to existing LCD filters. The combination of inventive red, green, and blue filters provides an especially advantageous system with a % $NTSC_{x,y}$ ratio of greater than 100%. This provides a better color gamut than existing LCD filters. To provide the same improvement in color gamut with existing LCD filters by fabricating them thicker (Example 9) would cause a greater loss of luminance, as shown in Table 8. Thus, this invention provides an improved color gamut for an electronic display without the loss of luminance that would be required for existing types of LCD color filters.

The advantage can be further seen in a comparison of power and lifetime. A power and lifetime model was used to predict the power necessary to drive an OLED display with the inventive filters vs. that necessary to drive the same display with the Comparative 2 filters, and the predicted lifetime of such displays with the calculated power. The results are shown in the table below.

TABLE 10

| Filter | NTSCx,y Ratio | Pixel Efficiency (cd/A) | Display Power (Watts) | Display Lifetime (Hours) |
|---|---|---|---|---|
| Red Comparative 2 ($R_{c2}$) | 102% | 1.51 | 73 | 52,679 |
| Green Comparative 2 ($G_{c2}$) | | 2.82 | | |
| Blue Comparative 2 ($B_{c2}$) | | 0.31 | | |
| Red Inventive ($R_i$) | 102% | 1.65 | 61 | 68,494 |
| Green Inventive ($G_i$) | | 3.59 | | |
| Blue Inventive ($B_i$) | | 0.54 | | |

Table 10 shows that the inventive filters, when compared to respective Comparative 2 filter examples having equal NTSC x,y ratio, result in lower power and improved lifetime for OLED display applications. Both the lower display power and increased display lifetime result from improved sub-pixel efficiencies of the higher transmitting inventive filters over the Comparative 2 filter example. The power consumption and lifetime data were calculated using an appropriate flat panel display performance model, specifically for an OLED display set to a D65 white point at 450 cd/m² peak luminance. Other display performance models or actual power/lifetime measurements can be used to show a similar advantage of the inventive filters over the Comparative 2 examples at equal NTSC x,y ratio for a display set to the same white point for color and luminance.

In a similar manner to that described for the above OLED device, the above color filters were cascaded with standard illuminant C. The following table shows the results for the % NTSCx,y ratios.

TABLE 11

| | CIE Standard Illuminant C | | | | |
|---|---|---|---|---|---|
| Example | Inventive/ Comparative | Red Filter | Green Filter | Blue Filter | NTSC Ratio |
| 1 | Comparative | $R_{c1}$ | $G_{c1}$ | $B_{c1}$ | 68.85 |
| 2 | Inventive | $R_i$ | $G_{c1}$ | $B_{c1}$ | 72.68 |
| 3 | Inventive | $R_{c1}$ | $G_i$ | $B_{c1}$ | 91.86 |
| 4 | Inventive | $R_{c1}$ | $G_{c1}$ | $B_i$ | 74.22 |
| 5 | Inventive | $R_i$ | $G_i$ | $B_{c1}$ | 96.39 |
| 6 | Inventive | $R_i$ | $G_{c1}$ | $B_i$ | 78.41 |
| 7 | Inventive | $R_{c1}$ | $G_i$ | $B_i$ | 98.00 |
| 8 | Inventive | $R_i$ | $G_i$ | $B_i$ | 102.9 |

In a similar manner, the above color filters were cascaded with standard illuminant D65. The following table shows the results for the % NTSCx,y ratios.

TABLE 12

CIE Standard Illuminant D65

| Example | Inventive/ Comparative | Red Filter | Green Filter | Blue Filter | NTSC Ratio |
|---|---|---|---|---|---|
| 1 | Comparative | $R_{c1}$ | $G_{c1}$ | $B_{c1}$ | 69.59 |
| 2 | Inventive | $R_i$ | $G_{c1}$ | $B_{c1}$ | 73.37 |
| 3 | Inventive | $R_{c1}$ | $G_i$ | $B_{c1}$ | 92.20 |
| 4 | Inventive | $R_{c1}$ | $G_{c1}$ | $B_i$ | 75.61 |
| 5 | Inventive | $R_i$ | $G_i$ | $B_{c1}$ | 96.63 |
| 6 | Inventive | $R_i$ | $G_{c1}$ | $B_i$ | 79.78 |
| 7 | Inventive | $R_{c1}$ | $G_i$ | $B_i$ | 99.12 |
| 8 | Inventive | $R_i$ | $G_i$ | $B_i$ | 103.95 |

In a similar manner, the above color filters were cascaded with a CCFL illuminant. The following table shows the results for the % NTSCx,y ratios.

TABLE 13

CCFL Illuminant

| Example | Inventive/ Comparative | Red Filter | Green Filter | Blue Filter | NTSC Ratio |
|---|---|---|---|---|---|
| 1 | Comparative | $R_{c1}$ | $G_{c1}$ | $B_{c1}$ | 70.32 |
| 2 | Inventive | $R_i$ | $G_{c1}$ | $B_{c1}$ | 75.52 |
| 3 | Inventive | $R_{c1}$ | $G_i$ | $B_{c1}$ | 88.94 |
| 4 | Inventive | $R_{c1}$ | $G_{c1}$ | $B_i$ | 72.36 |
| 5 | Inventive | $R_i$ | $G_i$ | $B_{c1}$ | 95.23 |
| 6 | Inventive | $R_i$ | $G_{c1}$ | $B_i$ | 77.77 |
| 7 | Inventive | $R_{c1}$ | $G_i$ | $B_i$ | 90.99 |
| 8 | Inventive | $R_i$ | $G_i$ | $B_i$ | 97.49 |

All of Tables 11 to 13 show that each of the inventive red, blue, and green color filters provides improved color gamut relative to existing LCD filters. This improvement is thus not limited to a single illuminant. The improvements are summarized in the table below.

TABLE 14

Above Illuminants

| Example | Inventive/ Comparative | Red Filter | Green Filter | Blue Filter | NTSC Ratio Range |
|---|---|---|---|---|---|
| 1 | Comparative | $R_{c1}$ | $G_{c1}$ | $B_{c1}$ | 67.7-70.3 |
| 2 | Inventive | $R_i$ | $G_{c1}$ | $B_{c1}$ | 70.7-75.5 |
| 3 | Inventive | $R_{c1}$ | $G_i$ | $B_{c1}$ | 88.9-92.2 |
| 4 | Inventive | $R_{c1}$ | $G_{c1}$ | $B_i$ | 72.3-75.6 |
| 5 | Inventive | $R_i$ | $G_i$ | $B_{c1}$ | 95.0-96.6 |
| 6 | Inventive | $R_i$ | $G_{c1}$ | $B_i$ | 76.7-79.8 |
| 7 | Inventive | $R_{c1}$ | $G_i$ | $B_i$ | 91.0-99.1 |
| 8 | Inventive | $R_i$ | $G_i$ | $B_i$ | 97.5-104.0 |

The inventive color filters individually show improved color gamut when substituted for a comparative color filter. When the inventive filters are combined, the improvement is even greater. The combination of inventive red, green, and blue filters again provides a % $NTSC_{x,y}$ ratio of greater than 95-100%, depending on the illuminant. The color filters of the present invention provide a significant advantage in color and efficiency when employed with broadband OLED emitters. However, the color filters of the present invention can also provide a significant color advantage when used with other types of displays. The color filters of the present invention can be used in liquid crystal displays, with broadband OLED backlights or conventional backlights such as cold-cathode fluorescent light, to provide an improved color gamut.

The invention has been described in detail with particular reference to certain preferred embodiments thereof, but it will be understood that variations and modifications can be effected within the spirit and scope of the invention.

The patents and other publications referred to herein are incorporated herein by reference.

PARTS LIST 10 electronic display
15 electronic display
20a group of pixels
20b group of pixels
20c group of pixels
20d group of pixels
21a pixel
21b pixel
21c pixel
21d pixel
25a red color filter
25b green color filter
25c blue color filter
30a anode
30b anode
30c anode
35 hole-injecting layer
40 hole-transporting layer
45 light-emitting layer
50 light-emitting layer
55 electron-transporting layer
60 electron-injecting layer
70 organic EL element
80 OLED substrate
85 filter substrate
90 cathode

What is claimed is:

1. An electronic display containing a light source and a color filter set, the color filter set comprising:
   a. a green color filter having a green filter layer comprising a first pigment having its maximum absorption at a wavelength from 600 to 700 nm wherein at least 90 volume percent of the first pigment particles have a particle size less than 300 nm, and a second pigment having its maximum absorption at a wavelength from 400 to 500 nm wherein at least 90 volume percent of the second pigment particles have a particle size less than 300 nm, and wherein the green filter layer has a transmittance of 60% or more at a wavelength of 520 nm and of no more than 10% at a wavelength of 480 nm and of no more than 10% at a wavelength of 590 nm;
   b. a blue color filter having a blue filter layer;
   c. a red color filter having a red filter layer; and
   d. wherein the color gamut defined by the electronic display has a % NTSCx,y ratio greater than 88%.

2. The electronic display of claim 1 wherein the green filter layer has a transmittance of no more than 10% at 580 nm and the transmittance peak of the green filter layer has a width at half-height of no more than 80 nm.

3. The electronic display of claim 1 wherein at least 90 volume percent of the first pigment particles have a particle size less than 100 nm and 100% of the second pigment particles have a particle size less than 100 nm.

4. The electronic display of claim 3 wherein no more than 10 volume percent of the first pigment particles have a particle size less than 5 nm and no more than 10 volume percent of the second pigment particles have a particle size less than 5 nm.

5. The electronic display of claim 4 wherein at least 90 volume percent of the first pigment particles have a particle size less than 50 nm and at least 90 volume percent of the second pigment particles have a particle size less than 50 nm.

6. The electronic display of claim 1 wherein the blue filter layer comprises a third pigment having a maximum absorption at a wavelength within the range of from 550 to 650 nm wherein at least 90 volume percent of the third pigment particles have a particle size less than 300 nm, and a fourth pigment having a maximum absorption at a wavelength within the range of from 500 to 600 nm wherein at least 90 volume percent of the fourth pigment particles have a particle size less than 300 nm, and the blue filter layer has a transmittance of 60% or more at a wavelength of 450 nm and of no more than 10% at all wavelengths in the range from 515 to 700 nm, wherein the color gamut defined by the electronic display has a % NTSCx,y ratio greater than 90%.

7. The electronic display of claim 6 wherein the blue filter layer has a transmittance of no more than 5% at all wavelengths in the range from 520 nm to 700 nm.

8. The electronic display of claim 6 wherein at least 90 volume percent of the third pigment particles have a particle size less than 100 nm and at least 90 volume percent of the fourth pigment particles have a particle size less than 100 nm.

9. The electronic display of claim 8 wherein no more than 10 volume percent of the third pigment particles have a particle size less than 5 nm and no more than 10 volume percent of the fourth pigment particles have a particle size less than 5 nm.

10. The electronic display of claim 9 wherein at least 90 volume percent of the third pigment particles have a particle size less than 50 nm and at least 90 volume percent of the fourth pigment particles have a particle size less than 50 nm.

11. The electronic display of claim 6 wherein the red filter layer comprises a fifth pigment having a maximum absorption at a wavelength within the range of from 450 to 575 nm wherein at least 90 volume percent of the fifth pigment particles have a particle size less than 300 nm, and the red filter layer has a transmittance of 80% or more at a wavelength of 650 nm, no more than 10% at a wavelength of 585 nm, and no more than 5% at all wavelengths in the range from 580 to 410 nm and wherein the color gamut defined by the electronic display has a % NTSCx,y ratio greater than 95%.

12. The electronic display of claim 11 wherein the light source is an OLED device and wherein the color gamut defined by the electronic display has a % NTSCx,y ratio greater than 100%.

13. The electronic display of claim 11 wherein the red filter layer has a transmittance of no more than 2% at all wavelengths in the range from 580 to 410 nm.

14. The electronic display of claim 13 wherein the red filter layer has a transmittance of no more than 1% at all wavelengths in the range from 575 to 410 nm.

15. The electronic display of claim 14 wherein the red filter layer has a transmittance of no more than 2% at 400 nm.

16. The electronic display of claim 11 wherein at least 90 volume percent of the fifth pigment particles have a particle size less than 100 nm.

17. The electronic display of claim 16 wherein no more than 10 volume percent of the fifth pigment particles have a particle size less than 5 nm.

18. The electronic display of claim 17 wherein at least 90 volume percent of the fifth pigment particles have a particle size less than 50 nm.

19. The electronic display of claim 1 further comprising portions wherein the display has no color filter.

20. An electronic display containing a light source and a color filter set, the color filter set comprising:

a. a green color filter having a green filter layer comprising a first pigment having its maximum absorption at a wavelength from 600 to 700 nm wherein at least 90 volume percent of the first pigment particles have a particle size less than 300 nm and a second pigment having its maximum absorption at a wavelength from 400 to 500 nm wherein at least 90 volume percent of the second pigment particles have a particle size less than 300 nm, and has a transmittance of 60% or more at a wavelength of 520 nm, no more than 10% at a wavelength of 480 nm, and no more than 10% at a wavelength of 590 nm;

b. a blue color filter having a blue filter layer comprising a third pigment having a maximum absorption at a wavelength within the range of from 550 to 650 nm wherein at least 90 volume percent of the third pigment particles have a particle size less than 300 nm, and a fourth pigment having a maximum absorption at a wavelength within the range of from 500 to 600 nm wherein at least 90 volume percent of the fourth pigment particles have a particle size less than 300 nm, and the blue filter layer has a transmittance of 60% or more at a wavelength of 450 nm and of no more than 10% at all wavelengths in the range from 515 to 700 nm;

c. a red color filter having a red filter layer; and d. wherein the color gamut defined by the electronic display has a % NTSCx,y ratio greater than 93%.

21. The electronic display of claim 20 wherein the blue filter layer has a transmittance of no more than 5% at all wavelengths in the range from 520 nm to 700 nm.

22. The electronic display of claim 20 wherein at least 90 volume percent of the third pigment particles have a particle size less than 100 nm and at least 90 volume percent of the fourth pigment particles have a particle size less than 100 nm.

23. The electronic display of claim 22 wherein no more than 10 volume percent of the third pigment particles have a particle size less than 5 nm and no more than 10 volume percent of the fourth pigment particles have a particle size less than 5 nm.

24. The electronic display of claim 23 wherein at least 90 volume percent of the third pigment particles have a particle size less than 50 nm and at least 90 volume percent of the fourth pigment particles have a particle size less than 50 nm.

25. The electronic display of claim 20 wherein the red filter layer comprises a fifth pigment having a maximum absorption at a wavelength within the range of from 450 to 575 nm wherein at least 90 volume percent of the fifth pigment particles have a particle size less than 300 nm, and the red filter layer has a transmittance of 80% or more at a wavelength of 650 nm, no more than 10% at a wavelength of 585 nm, and no more than 5% at all wavelengths in the range from 580 to 410 nm.

26. The electronic display of claim 25 wherein the red filter layer has a transmittance of no more than 2% at all wavelengths in the range from 580 to 410 nm.

27. The electronic display of claim 26 wherein the red filter layer has a transmittance of no more than 1% at all wavelengths in the range from 575 to 410 nm.

28. The electronic display of claim 27 wherein the red filter layer has a transmittance of no more than 2% at 400 nm.

29. The electronic display of claim 25 wherein at least 90 volume percent of the third pigment particles have a particle size less than 100 nm.

30. The electronic display of claim 29 wherein no more than 10 volume percent of the third pigment particles have a particle size less than 5 nm.

31. The electronic display of claim 30 wherein at least 90 volume percent of the third pigment particles have a particle size less than 50 nm.

32. The electronic display of claim 20 further comprising portions wherein the display has no color filter.

33. An electronic display containing a light source and a color filter set, the color filter set comprising:
   a. a green color filter having a green filter layer comprising a first pigment having its maximum absorption at a wavelength from 600 to 700 nm wherein at least 90 volume percent of the first pigment particles have a particle size less than 300 nm and a second pigment having its maximum absorption at a wavelength from 400 to 500 nm wherein at least 90 volume percent of the second pigment particles have a particle size less than 300 nm, and has a transmittance of 60% or more at a wavelength of 520 nm, no more than 10% at a wavelength of 480 nm, and no more than 10% at a wavelength of 590 nm;
   b. a blue color filter having a blue filter layer;
   c. a red color filter having a red filter layer comprising a third pigment having a maximum absorption at a wavelength within the range of from 450 to 575 nm wherein at least 90 volume percent of the third pigment particles have a particle size less than 300 nm, and the red filter layer has a transmittance of 80% or more at a wavelength of 650 nm, no more than 10% at a wavelength of 585 nm, and no more than 5% at all wavelengths in the range from 580 to 410 nm; and
   d. wherein the color gamut defined by the electronic display has a % NTSCx,y ratio greater than 93%.

34. The electronic display of claim 33 wherein the red filter layer has a transmittance of no more than 2% at all wavelengths in the range from 580 to 410 nm.

35. The electronic display of claim 34 wherein the red filter layer has a transmittance of no more than 1% at all wavelengths in the range from 575 to 410 nm.

36. The electronic display of claim 35 wherein the red filter layer has a transmittance of no more than 2% at 400 nm.

37. The electronic display of claim 33 wherein at least 90 volume percent of the third pigment particles have a particle size less than 100 nm.

38. The electronic display of claim 37 wherein no more than 10 volume percent of the third pigment particles have a particle size less than 5 nm.

39. The electronic display of claim 38 wherein at least 90 volume percent of the third pigment particles have a particle size less than 50 nm.

40. The electronic display of claim 33 wherein the green filter layer has a transmittance of no more than 10% at 580 nm and the transmittance peak of the green filter layer has a width at half-height of no more than 80 nm.

41. The electronic display of claim 33 wherein at least 90 volume percent of the first pigment particles have a particle size less than 100 nm and 100% of the second pigment particles have a particle size less than 100 nm.

42. The electronic display of claim 41 wherein no more than 10 volume percent of the first pigment particles have a particle size less than 5 nm and no more than 10 volume percent of the second pigment particles have a particle size less than 5 nm.

43. The electronic display of claim 42 wherein at least 90 volume percent of the first pigment particles have a particle size less than 50 nm and at least 90 volume percent of the second pigment particles have a particle size less than 50 nm.

44. The electronic display of claim 33 further comprising portions wherein the display has no color filter.

45. An electronic display containing a light source and a color filter set, the color filter set comprising:
   a. a green color filter having a green filter layer comprising a first pigment having its maximum absorption at a wavelength from 600 to 700 nm and a second pigment having its maximum absorption at a wavelength from 400 to 500 nm, wherein the green filter layer has chromaticity coordinates (x, y) in the 1931 CIE XYZ colorimetric system, calculated using CIE Standard Illuminant D65, that satisfy the expressions $0.19 \leq x \leq 0.24$ and $0.68 \leq y \leq 0.72$;
   b. a blue color filter having a blue filter layer comprising a third pigment having a maximum absorption at a wavelength within the range of from 550 to 650 nm and a fourth pigment having a maximum absorption at a wavelength within the range of from 500 to 600 nm, wherein the blue filter layer has chromaticity coordinates (x, y) in the 1931 CIE XYZ calorimetric system, calculated using CIE Standard Illuminant D65, that satisfy the expressions $0.134 \leq x \leq 0.15$ and $0.03 \leq y \leq 0.06$;
   c. a red color filter having a red filter layer comprising a fifth pigment having a maximum absorption at a wavelength within the range of from 450 to 575 nm, wherein the red filter layer has chromaticity coordinates (x, y) in the 1931 CIE XYZ calorimetric system, calculated using CIE Standard Illuminant D65, that satisfy the expressions $0.665 \leq x \leq 0.68$ and $0.30 \leq y \leq 0.34$; and
   d. wherein the color gamut defined by the electronic display has a % NTSCx,y ratio greater than 100%.

* * * * *